US009252709B2

(12) United States Patent
Wu et al.

(10) Patent No.: US 9,252,709 B2
(45) Date of Patent: Feb. 2, 2016

(54) APPARATUSES AND METHODS FOR PROVIDING OSCILLATION SIGNALS

(71) Applicant: MICRON TECHNOLOGY, INC., Boise, ID (US)

(72) Inventors: Jun Wu, Jiangsu (CN); Bin Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/882,144

(22) PCT Filed: Oct. 19, 2012

(86) PCT No.: PCT/CN2012/001408
§ 371 (c)(1),
(2) Date: Mar. 7, 2014

(87) PCT Pub. No.: WO2014/059560
PCT Pub. Date: Apr. 24, 2014

(65) Prior Publication Data
US 2014/0176249 A1    Jun. 26, 2014

(51) Int. Cl.
| H03K 3/02 | (2006.01) |
| H03K 4/502 | (2006.01) |
| H03B 9/14 | (2006.01) |
| H03L 1/00 | (2006.01) |
| H03L 7/089 | (2006.01) |

(52) U.S. Cl.
CPC H03B 9/141 (2013.01); H03L 1/00 (2013.01); *H03L 7/0891* (2013.01)

(58) Field of Classification Search
CPC ........................................................ H03K 4/502

USPC ................................................... 331/111, 143
See application file for complete search history.

(56) References Cited

U.S. PATENT DOCUMENTS

| 4,208,639 A | 6/1980 | Stickel |
| 4,570,130 A | 2/1986 | Grindel et al. |
| 5,070,311 A | 12/1991 | Nicolai |

(Continued)

FOREIGN PATENT DOCUMENTS

| CN | 101286733 A | 10/2008 |
| CN | 101582631 A | 11/2009 |

OTHER PUBLICATIONS

International Search Report & Written Opinion for PCT Appl. No. PCT/CN2012/001408 dated Jul. 25, 2013.

*Primary Examiner* — Joseph Chang
(74) *Attorney, Agent, or Firm* — Dorsey & Whitney LLP

(57) ABSTRACT

Apparatuses and methods are disclosed for oscillators that are substantially insensitive to supply voltage variations. In one such example apparatus, a capacitance circuit is configured to be charged and discharged. Charging and discharging circuits are coupled to the capacitance circuit and configured to charge and discharge, respectively, the capacitance circuit by charging and discharging currents responsive to charge and discharge signals. A control circuit is coupled to the charging circuit and the discharging circuit, and is configured to provide the charge and discharge signals responsive to a voltage of the capacitance circuit, and is further configured to provide an oscillation signal responsive to the voltage of the capacitance circuit. The charging current, the discharging current, or both the charging and discharging currents are proportional to a difference between a first reference voltage and a second reference voltage.

32 Claims, 9 Drawing Sheets

(56) References Cited

U.S. PATENT DOCUMENTS

| | | |
|---|---|---|
| 5,412,350 A | 5/1995 | Kim |
| 6,356,161 B1 | 3/2002 | Nolan et al. |
| 6,552,622 B1 | 4/2003 | Shearon et al. |
| 6,642,804 B2 | 11/2003 | Chrissostomidis et al. |
| 7,026,882 B2 | 4/2006 | Ganivet et al. |
| 7,176,765 B1 | 2/2007 | Shorb et al. |
| 8,076,984 B2 | 12/2011 | Song et al. |
| 8,350,631 B1 * | 1/2013 | Wadhwa et al. ............... 331/111 |
| 2007/0109062 A1 | 5/2007 | Brokaw et al. |
| 2007/0146087 A1 * | 6/2007 | Hwang et al. ................. 331/111 |
| 2010/0231312 A1 | 9/2010 | Denier |
| 2011/0316515 A1 | 12/2011 | Mitsuda et al. |

\* cited by examiner

APPARATUSES AND METHODS FOR PROVIDING OSCILLATION SIGNALS

TECHNICAL FIELD

Embodiments of the invention relate generally to integrated circuits, and more particularly, in one or more of the illustrated embodiments, to oscillators that are supply voltage insensitive.

BACKGROUND OF THE INVENTION

Oscillators find many applications in integrated circuits, for example to control the timing of various components and circuits. One type of oscillator is an RC (resistance-capacitance) oscillator that provides an oscillation signal by charging and discharging a capacitance through a resistance. The period of the oscillation signal generated by an RC oscillator can depend on, among other things, the magnitude of a supply voltage provided to the oscillator. Generally, the period can be defined by $$TOSC = \frac{(C*V)}{IPU} + \frac{(C*V)}{IPD}, \quad \text{(Equation 1)}$$

where C is the magnitude of the capacitance being charged and discharged, V is the voltage swing of the capacitance (typically from a reference voltage, such as ground, to the supply voltage, such as VCC), IPU is the charging current (e.g., the pull-up current), and IPD is the discharging current (e.g., the pull-down current). In order to help provide a stable oscillation signal period, the supply voltage is regulated in some integrated circuits. However, a voltage regulator can occupy space on and consume power in an integrated circuit, both of which may be undesirable in some instances, such as in integrated circuits designed for portable devices.

If the supply voltage for an RC oscillator is left unregulated, though, the capacitance may be charged to (and discharged from) higher or lower voltages at slower or faster charge (and discharge) rates. Furthermore, the characteristics of the capacitance may vary depending on the voltages provided to the different nodes of the capacitance (e.g., the capacitor may not have a substantially constant capacitance-voltage (C-V) characteristic curve). These variations may, in turn, cause the period of the oscillation signal provided by the oscillator to vary responsive to changes in the supply voltage provided to the oscillator.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
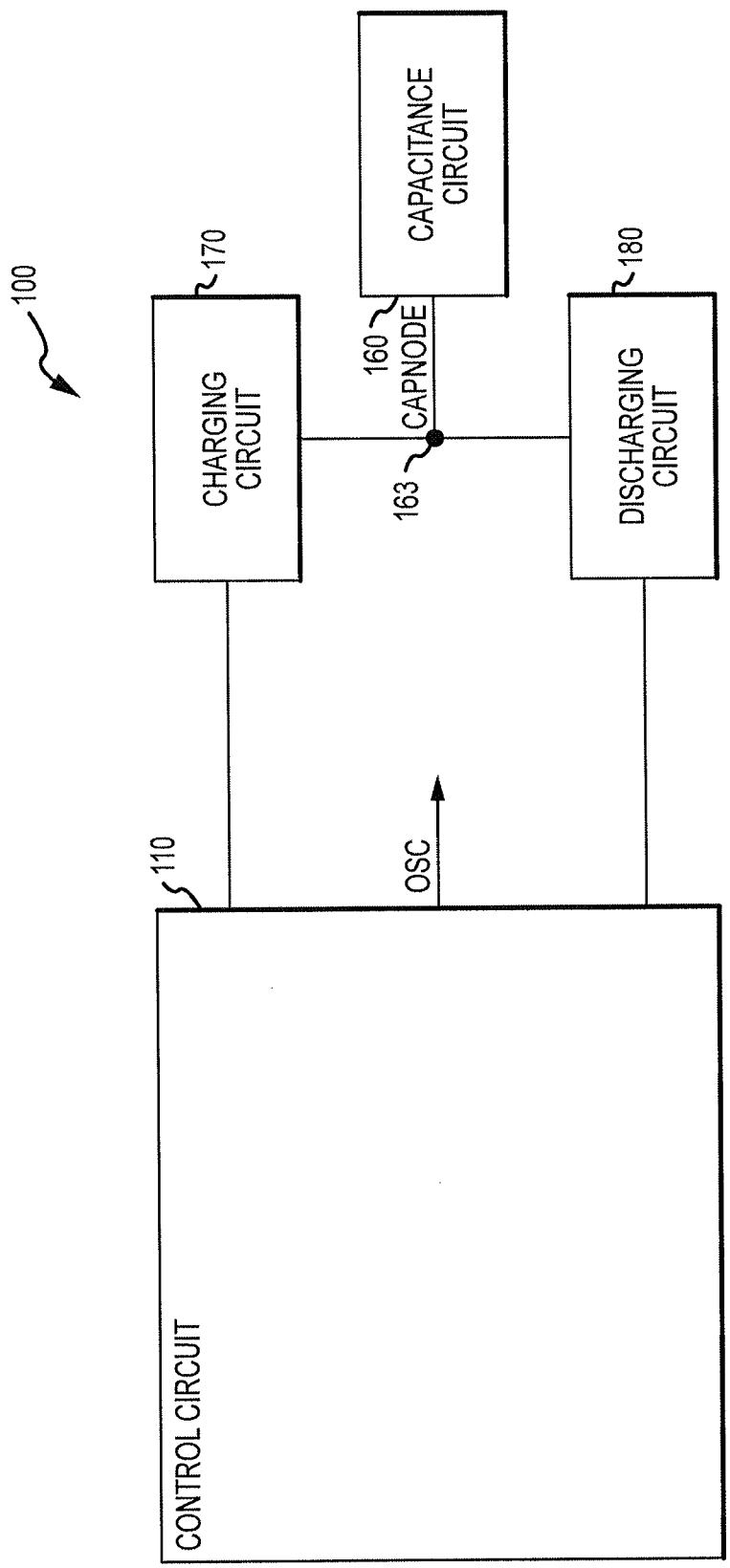
FIG. 1 is a block diagram of an oscillator according to an embodiment of the present invention.

FIG. 1 illustrates an oscillator circuit 100 that may be included in an apparatus (such as an integrated circuit, a memory device, a memory system, an electronic device or system, a smart phone, a tablet, a computer, a server, etc.). The oscillator circuit 100 includes a control circuit 110 coupled to both a charging circuit 170 and a discharging circuit 180. A capacitance circuit 160 is also coupled to both the charging circuit 170 and the discharging circuit 180. The oscillator circuit 100 provides (e.g., generates, derives from other signals, etc.) an oscillation signal OSC.

The capacitance circuit 160 is configured to be charged by charging circuit 170 and is also configured to be discharged by discharging circuit 180. The capacitance circuit 160 is coupled to a measurement node 163 so that, for example, the voltage CAPNODE of the capacitance circuit 160, which is proportional to the amount of charge stored in the capacitance circuit 160, can be measured and such measurement can be made available for use by other elements of the oscillator circuit 100 (e.g., the control circuit 110).

The control circuit 110 is configured to provide control signals to the charging circuit 170 and the discharging circuit 180 responsive to the voltage CAPNODE of the capacitance circuit 160 (as measured, for example, at the measurement node 163). The control signals provided by the control circuit 110 may include signals such as, for example, charge and discharge signals. The control circuit 110 may also be configured to provide control currents. The control currents provided by the control circuit 110 may include currents such as, for example, a reference current, a charging current, and/or a discharging current, or a signal indicative of a reference, charging or discharging current. One or more of the reference current, the charging current, and the discharging current, or a signal indicative thereof, may be proportional (directly proportional, indirectly proportional, or any other sort of relationship) to a difference between a first reference voltage and a second reference voltage. The first and second reference voltages may be defined by the control circuit 110. In some embodiments, the difference between the first and second reference voltages is proportional to the supply voltage provided to (e.g., outputted to, used by, etc.) the oscillator circuit 100, for example VCC, in which case the one or more of the reference current, the charging current, and the discharging current, or a signal indicative thereof may also be proportional to the supply voltage. In some examples, one or both of the first and second reference voltages may be proportional to the supply voltage. In general, the first and second reference voltages and/or the one or more of the reference current, the charging current, and the discharging current, or a signal indicative thereof may or may not be proportional to the supply voltage.

The control circuit 110 is also configured to provide the oscillation signal OSC responsive to the voltage CAPNODE of the capacitance circuit 160. For example, the oscillation signal OSC may be provided responsive to whether the voltage CAPNODE of the capacitance circuit 160, as measured on the measurement node 163, is substantially equal to or greater than or less than one of the one or more reference voltages, thereby substantially clamping (e.g., limiting the swing of) the voltage CAPNODE of the capacitance circuit 160 between two reference voltages.

The oscillation signal OSC may be substantially insensitive to (e.g., independent from) variations in the supply voltage provided to the oscillator circuit 100. As used herein, substantially insensitive to may mean that the period of the oscillation signal varies less than 0.1%, 1%, 5%, or 10% as compared with the variation in the supply voltage. For example, the oscillation signal OSC may have a relatively constant (e.g., within 0.1%, 1%, 5%, or 10%) oscillation period, even with variations in the supply voltage provided to the oscillator circuit 100, due to a known proportionality between one or more of the currents and one or more of the reference voltages or a difference between the reference voltages—the relationship being, for example, that one or more of the currents is directly proportional to the supply voltage and the difference between two reference voltages is also directly proportional to the supply voltage. In this example, the direct proportionality of one or more of the currents to the supply voltage and the direct proportionality of the difference between two reference voltages to the supply voltage result in the current(s) and the difference between the reference voltages both changing proportionally, responsive to changes in the supply voltage. In this manner, the changes in the current (s) may be used to offset the changes in the difference between the reference voltages such that the oscillation signal OSC is substantially insensitive to supply voltage variations.

The charging circuit 170 is coupled to the control circuit 110 and receives control signals and control currents or signals indicative of such currents (such as the reference current or the charging current) from the control circuit 110. In response to receiving the control signals and/or currents, the charging circuit 170 charges the capacitance circuit 160 by the charging current. As described below, in one embodiment, the charging circuit 170 may derive the charging current by mirroring the reference current provided by the control circuit based on a control signal indicative of the reference current. The charging current may alternatively be received by the charging circuit 170 in a different manner, such as by receiving a signal indicating the magnitude that the charging current should have, receiving the charging current directly, and so forth. Similarly, the discharging circuit 180 is also coupled to the control circuit 110 and receives control signals and control currents from the control circuit 110. In response to receiving the control signals and control currents or signals indicative of such currents (such as the reference current or the discharging current), the discharging circuit 180 discharges the capacitance circuit 160 by the discharging current. The reference current, the charging current, and/or the discharging current, or one or more of the signals corresponding thereto, may be substantially constant in some embodiments.

Figure 2:
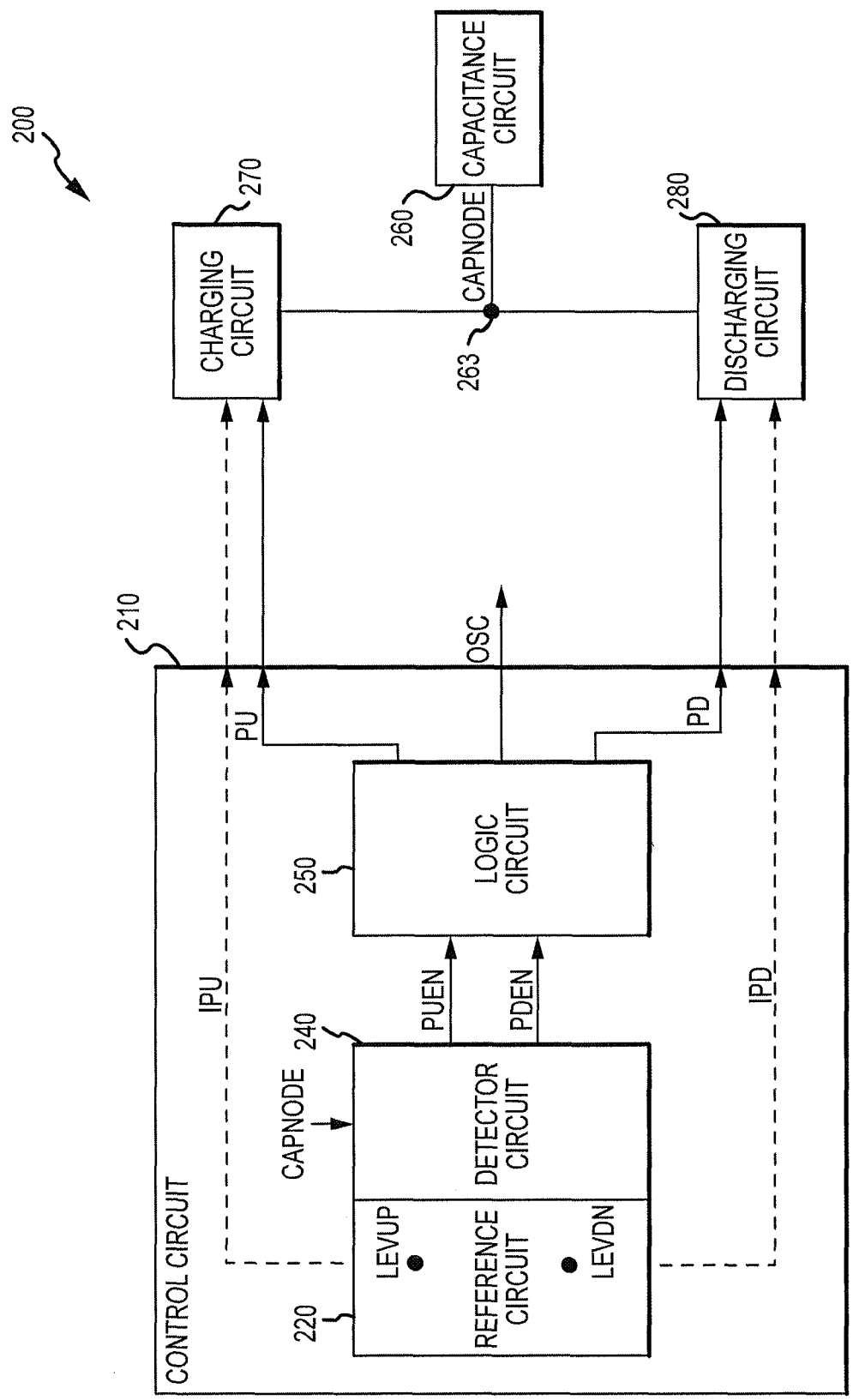
FIG. 2 is a block diagram of an oscillator according to an embodiment of the invention.

FIG. 2 illustrates a block diagram of an oscillator circuit 200 according to an embodiment of the invention. The oscillator circuit 200 in FIG. 2 includes a control circuit 210, a capacitance circuit 260, a charging circuit 270, and a discharging circuit 280.

The control circuit 210 in FIG. 2 includes a reference circuit 220 configured to provide a reference current, a first reference voltage LEVDN, and a second reference voltage LEVUP. The reference current is proportional to a difference between the first and second reference voltages LEVDN, LEVUP. At least one of the first and second reference voltages LEVDN, LEVUP may be proportional to a supply voltage provided to the circuit, in which case the reference current may also be proportional to the supply voltage. The reference circuit 220 also provides at least one of a charging current IPU, a discharging current IPD, and one or more control signals indicative of the charging current IPU or the discharging current IPD, as illustrated in dashed lines in FIG. 2. At least one of the charging current IPU, the discharging current IPD, and the one or more control signals may be proportional to the reference current. The reference circuit 220 may provide at least one of the charging current IPU and the discharging current IPD by mirroring the reference current in some embodiments, may provide a signal indicative of the charging current IPU and/or the discharging current IPD such that the charging circuit 270 and/or the discharging circuit 280 can provide the appropriate charging current IPU and/or the discharging current IPD, or may provide the currents or signals indicative of the currents in any appropriate manner.

The control circuit 210 may also include a detector circuit 240 coupled to the reference circuit 220 and configured to provide control signals PUEN, PDEN responsive to a comparison of a voltage CAPNODE of the capacitance circuit 260 (as measured at the measurement node 263) with the first and second reference voltages. For example, the detector circuit 240 may provide the control signal PUEN responsive to the voltage CAPNODE of the capacitance circuit 260 being substantially equal to (e.g., within 0.1%, 1%, 5%, or 10% of) or less than the first reference voltage. The control signal PUEN may indicate that the capacitance circuit 260 needs to be charged (e.g., "pulled up"), and may therefore serve as a charge enable control signal. The detector circuit 240 may also provide the control signal PDEN responsive to the voltage CAPNODE of the capacitance circuit 260 being substantially equal to (e.g., within 0.1%, 1%, 5%, or 10% of) or greater than the second reference voltage. The control signal PDEN may indicate that the capacitance circuit 260 needs to be discharged, (e.g., "pulled down"), and may therefore serve as a discharge enable signal. As will be explained below, the detector circuit 240 helps clamp the voltage CAPNODE of the capacitance circuit 260 in between the first and second reference voltages defined by the reference circuit 220, with the difference between the first and second reference voltages being proportional to the reference current.

The control circuit 210 also includes a logic circuit 250 coupled to the detector circuit 240 and configured to provide a charge signal PU, a discharge signal PD, and the oscillation signal OSC responsive to the control signals PUEN, PDEN. The logic circuit 250 provides the charge signal PU responsive to the control signal PUEN and provides the discharge signal PD responsive to the control signal PDEN. Furthermore, the logic circuit 250 provides the oscillation signal OSC responsive to the control signals PUEN, PDEN.

The charging circuit 270 receives the charge signal PU as well as the charging current IPU or a signal indicative of the charging current IPU. In response to the charge signal PU, the charging circuit 270 charges the capacitance circuit 260 by the charging current IPU (e.g., at a rate determined by the charging current IPU). Similarly, the discharging circuit 280 receives the discharge signal PD as well as the discharging current IPD or a signal indicative of the discharging current IPD. In response to the discharge signal PD, the discharging circuit 280 discharges the capacitance circuit 260 by the discharging current IPD (e.g., at a rate determined by the discharging current IPD). In some embodiments one or both of the charging current IPU and the discharging current IPD may be constant as the capacitance circuit 260 is respectively charged and/or discharged. Furthermore, in some embodiments, the charging current IPU may have substantially the same magnitude as the discharging current IPD (such that the capacitance circuit 260 is charged and discharged at substantially the same rate), whereas in other embodiments, one of the charging current IPU and the discharging current IPD may be much greater in magnitude than the other. For example, as will be described below in the embodiment illustrated in FIG. 5, the discharging current IPD may have a very large magnitude as compared with the charging current IPU such that the capacitance circuit 260 is discharged very quickly as compared with the rate at which it is charged. As another example, the charging current IPU may be some multiple of the discharging current IPD, or the discharging current IPD may be some multiple of the charging current IPU.

Figure 3:
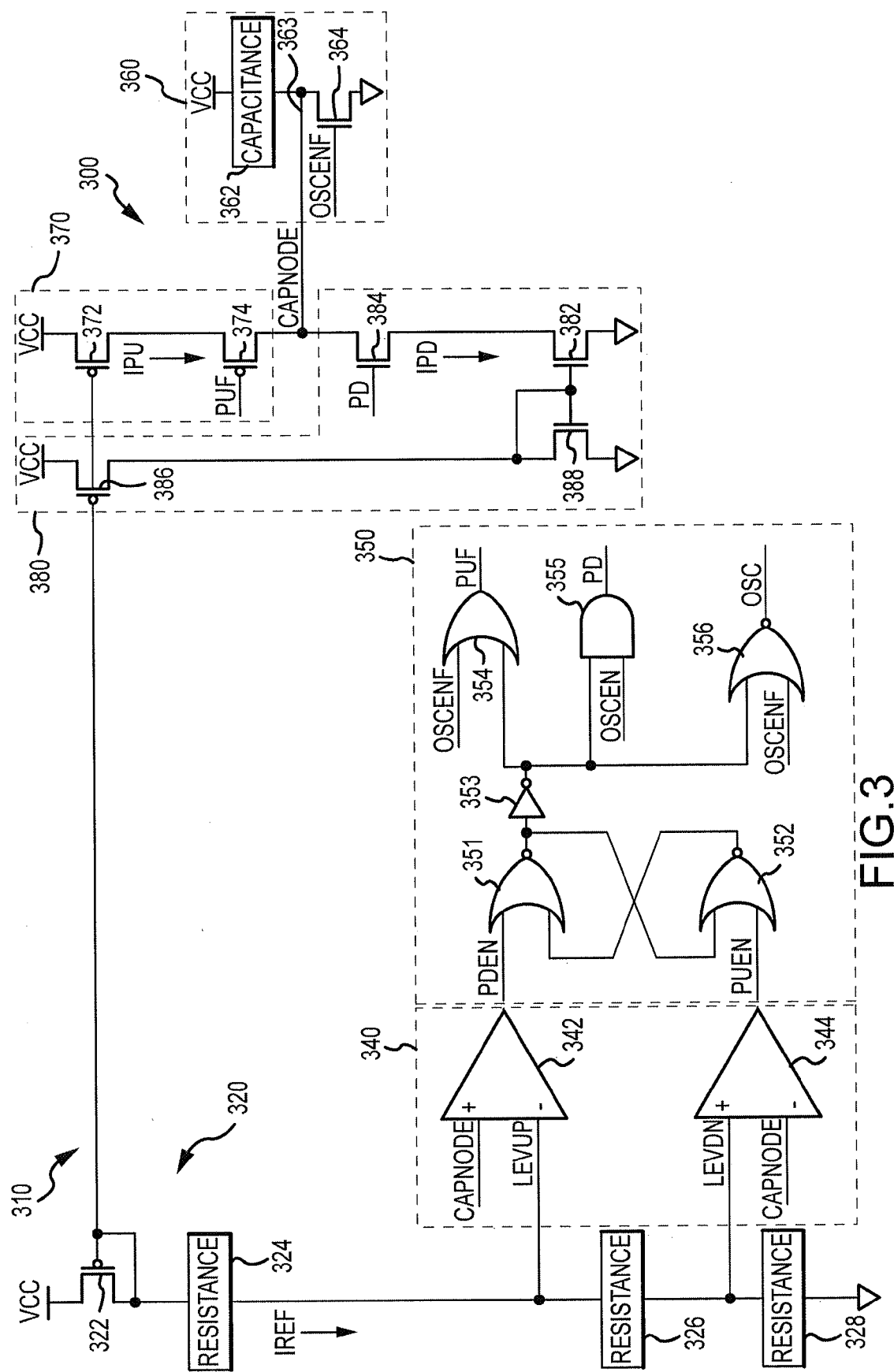
FIG. 3 is a partial schematic diagram of an oscillator according to an embodiment of the invention.

FIG. 3 illustrates a schematic diagram of an oscillator circuit 300 according to an embodiment of the invention. The oscillator 300 may be used for the oscillator circuit 100 in FIG. 1 or the oscillator circuit 200 in FIG. 2. Similar to the oscillator circuits 100, 200 in FIGS. 1 and 2, the oscillator circuit 300 in FIG. 3 includes a control circuit 310, a capacitance circuit 360, a charging circuit 370, and a discharging circuit 380. The control circuit 310 also includes a reference circuit 320, a detector circuit 340, and a logic circuit 350.

The reference circuit 320 includes a p-channel field effect transistor (pFET) 322 with its source coupled to a supply voltage node, such as VCC. The drain of the pFET 322 is coupled to a voltage divider with three serially coupled resistances 324, 326, 328, which are in turn coupled to a reference voltage node such as ground. The resistances may be resistors, FETs, and so forth, and, in some embodiments (see, e.g., FIG. 5), one or more of the resistances may be omitted. The gate of the pFET 322 is also coupled to its drain, thereby forming one portion of a pFET current mirror. As will be described below, the gate of the pFET 322 is also coupled to at least one of the charging and discharging circuits 370, 380.

In the example shown in FIG. 3, the reference circuit 320 provides a reference current IREF, which is directly proportional to the supply voltage VCC and inversely proportional to the resistances 324, 326, 328. The voltage divider of the reference circuit 320 also defines (e.g., generates, sets, characterizes) a first reference voltage LEVDN by tapping the voltage between resistances 326 and 328. The voltage divider of the reference circuit 320 also defines a second reference voltage LEVUP by tapping the voltage between resistances 324 and 326. As will be appreciated, because the reference current IREF is proportional to the difference between the first and second reference voltages LEVDN, LEVUP, both the reference current IREF and the difference between the first and second reference voltages will increase proportional to increases in the supply voltage VCC and will decrease proportional to decreases in the supply voltage VCC. Additionally, generally speaking, the rate at which the reference current IREF increases or decreases will be the same rate at which the difference between the first and second reference voltages LEVDN, LEVUP respectively increases or decreases because of the resistances 324, 326, 328, thereby providing a fixed, proportional relationship between the reference current IREF and the difference (e.g., swing) between the second and first reference voltages LEVUP, LEVDN. Also, as will be appreciated, the reference current IREF will be substantially constant for a given supply voltage VCC, temperature, and process characterization, which, as described in more detail below allows for at least one of the charging and discharging currents IPU, IPD to be substantially constant for a given supply voltage VCC.

In some embodiments, the resistances 324, 326, 328 may be insensitive to operating temperature variations, whereas in other embodiments, the resistances 324, 326, 328 may become more or less resistive responsive to operating temperature variations, thereby providing the oscillator circuit 300 with a temperature dependency.

The detector circuit 340 includes two comparators 342, 344, each with positive and negative input nodes. Each of the comparators may be, for example, an operational amplifier in some embodiments, or another suitable form of comparator in other embodiments. The voltage CAPNODE of the capacitance circuit 360 (as measured at the measurement node 363 of the capacitance circuit 360, which is described in more detail below) is provided to the positive input node of the first comparator 342, and the second reference voltage LEVUP from the reference circuit 320 is provided to the negative input node of the first comparator 342. The first comparator 342 provides, in response, the control signal PDEN, which, as mentioned above may be an enable signal indicating that the capacitance circuit 360 needs to be discharged.

Similarly, the voltage CAPNODE of the capacitance circuit 360 is provided to the negative input node of the second comparator 344, and the first reference voltage LEVDN from the reference circuit 320 is provided to the positive input node of the second comparator 344. The second comparator 344 provides, in response, the control signal PUEN, which, as mentioned above may be an enable signal indicating that the capacitance circuit 360 needs to be charged.

The comparators 342, 344 may thus act as "levers" to control the charging and discharging of the capacitance circuit 360 based on the voltage CAPNODE of the capacitance circuit 360 by substantially clamping the voltage CAPNODE between the first and second reference voltages LEVDN, LEVUP. In other words, the comparators 342, 344 provide control signals that keep the voltage CAPNODE of the capacitance circuit 360 within a certain range, and, as described above, that range, the difference between the first and second reference voltages LEVDN, LEVUP, is proportional to the supply voltage provided to the oscillator circuit 300. The comparators 342, 344 keep the voltage CAPNODE with that range by, in some embodiments, comparing the voltage CAPNODE of the capacitance circuit 360 against the second and first reference voltages LEVUP, LEVDN.

The control signals PDEN, PUEN are provided by the detector circuit 340 to the logic circuit 350. The logic circuit 350 includes two NOR gates 351, 352 coupled in a latch arrangement, with the control signal PDEN provided to the first NOR gate 351 and the control signal PUEN provided to the second NOR gate 352. The output of the latched NOR gates 351, 352 is coupled to an inverter 353, whose output is in turn coupled to an OR gate 354, an AND gate 355, and another NOR gate 356. An OSCENF signal, which may be an active low enable signal for the oscillator 300, is provided to the OR gate 354 and the NOR gate 356. The OR gate 354 in turn provides a PUF signal, which may be an active low charge signal, and the NOR gate 356 provides the OSC oscillation signal. The AND gate 355 provides a PD signal, which may be a discharge signal. In some embodiments, however, only one of the OR gate 354 and the AND gate 355 is needed, in which case the PUF signal may be provided as the PD signal, or vice versa. In some embodiments, the output of the NOR gate 356 may be provided to the clock node of a flip-flop with its input coupled to its output to serve as a frequency divider in order to correct any duty cycle deficiencies of the OSC signal (not shown in FIG. 3).

The capacitance circuit 360 of the oscillator circuit 300 may include a capacitance 362 coupled between the supply voltage such as VCC and a measurement node 363. The capacitance 362 may be, for example, a pFET-based capacitor (with the source and drain of the pFET coupled together), an nFET-based capacitor, a discrete component capacitor, or any other type of capacitance. In some embodiments, the capacitance 362 may include two or more capacitors coupled in series or parallel. In general, the capacitance 362 may have a substantially constant capacitance-voltage (C-V) characteristic over a certain range, such as the difference between the first and second reference voltages LEVDN, LEVUP when present at one of the nodes (e.g., the measurement node 363) of the capacitance 362.

The capacitance circuit 360 may further include an n-channel field effect transistor (nFET) 364 coupled between the measurement node 363 and a reference voltage node such as ground. The OSCENF signal may be provided to the gate of the nFET 364 in order to, in part, selectively enable and disable the oscillator circuit 300.

The charging circuit 370 illustrated in FIG. 3 includes two pFETs 372, 374 coupled in series between a supply voltage node VCC and the measurement node 363 of the capacitance circuit 360. The gate of the first pFET 372 is coupled to the gate of the pFET 322 of the reference circuit 320 (described above), and, as such, serves as the other component of a current mirror. Thus, the pFETs 322, 372 form a current mirror that mirrors the current IREF that is provided in the reference circuit 320 to provide the charging current IPU within the charging circuit 370. The current mirror formed by pFETs 322, 372 may be a simple current mirror, a cascode current mirror, a plurality of current mirrors coupled in series or parallel, and so forth. When pFET 374 is conductive (e.g., when the charge signal PUF is a logic low), pFET 372 charges the capacitance circuit 360 at a rate proportional to the reference current IREF whereas when pFET 374 is non-conductive, very little to no current flows from pFET 372 to the capacitance circuit 360.

The discharging circuit 380 includes a pFET 386 with a source coupled to the supply voltage node such as VCC and a drain coupled in series with the drain of an nFET. The source of the nFET 388 is coupled to a reference voltage node, such as ground. The gate of the pFET 386 is, like the pFET 372 of the charging circuit 370, coupled to the gate of the pFET 322 of the reference voltage, and, as such, serves as the other component of a second current mirror. Thus the pFETs 322, 386 form a current mirror that mirrors the current IREF that is provided in the reference circuit 320 to provide the discharging current IPD within the discharging circuit 380. The gate of the nFET 388 is coupled to its drain, thereby forming the first component of a third current mirror. The gate of the nFET 388 is also coupled to the gate of another nFET 382 coupled between a reference voltage node such as ground and yet another nFET 384. The drain of nFET 384 is in turn coupled to the measurement node 363 of the capacitance circuit 360. Thus, the nFETs 388, 382 form a third current mirror that mirrors the current IREF that is provided in the reference circuit 320 to provide the discharging current IPD in the discharging circuit 380. The current mirrors formed by the pFETs 322, 386 and the nFETs 388, 382 may be any form of current mirror. In some embodiments, the current mirror formed by nFETs 388, 382 may be matched with the current mirrors formed by pFETs 322, 372 and pFETs 322, 386.

When nFET 384 is conductive (e.g., when the discharge signal PD is a logic high), nFET 382 discharges the capacitance circuit 360 at a rate proportional to the reference current IREF whereas when nFET 384 is non-conductive, very little to no current flows from the capacitance circuit 360 the reference voltage node such as ground.

Because little to no current flows to the capacitance circuit 360 when the nFET 374 is non-conductive (e.g., is disabled), and because little to no current flows from the capacitance circuit 360 when the pFET 384 is non-conductive (e.g., is disabled), the oscillator circuit 300 may consume relatively little static power.

In this manner, the period TOSC of the oscillation signal OSC can be insensitive to changes in the supply voltage because the charging current IPU has a fixed, proportional relationship with the difference between reference voltages LEVDN, LEVUP, between which the voltage CAPNODE on the measurement node 363 of the capacitance circuit 360 may swing. The difference between the reference voltages LEVDN, LEVUP has a fixed proportional relationship to the charging current IPU because both are proportional to the supply voltage in the example illustrated in FIG. 3.

As described herein, the nFET 364, the OR gate 354, and the NOR gate 356 may together form an enable circuit for the oscillator circuit 300 in some embodiments, and the enable circuit may be controlled by the OSCEN and/or OSCENF signals, which may be complementary.

Figure 4:
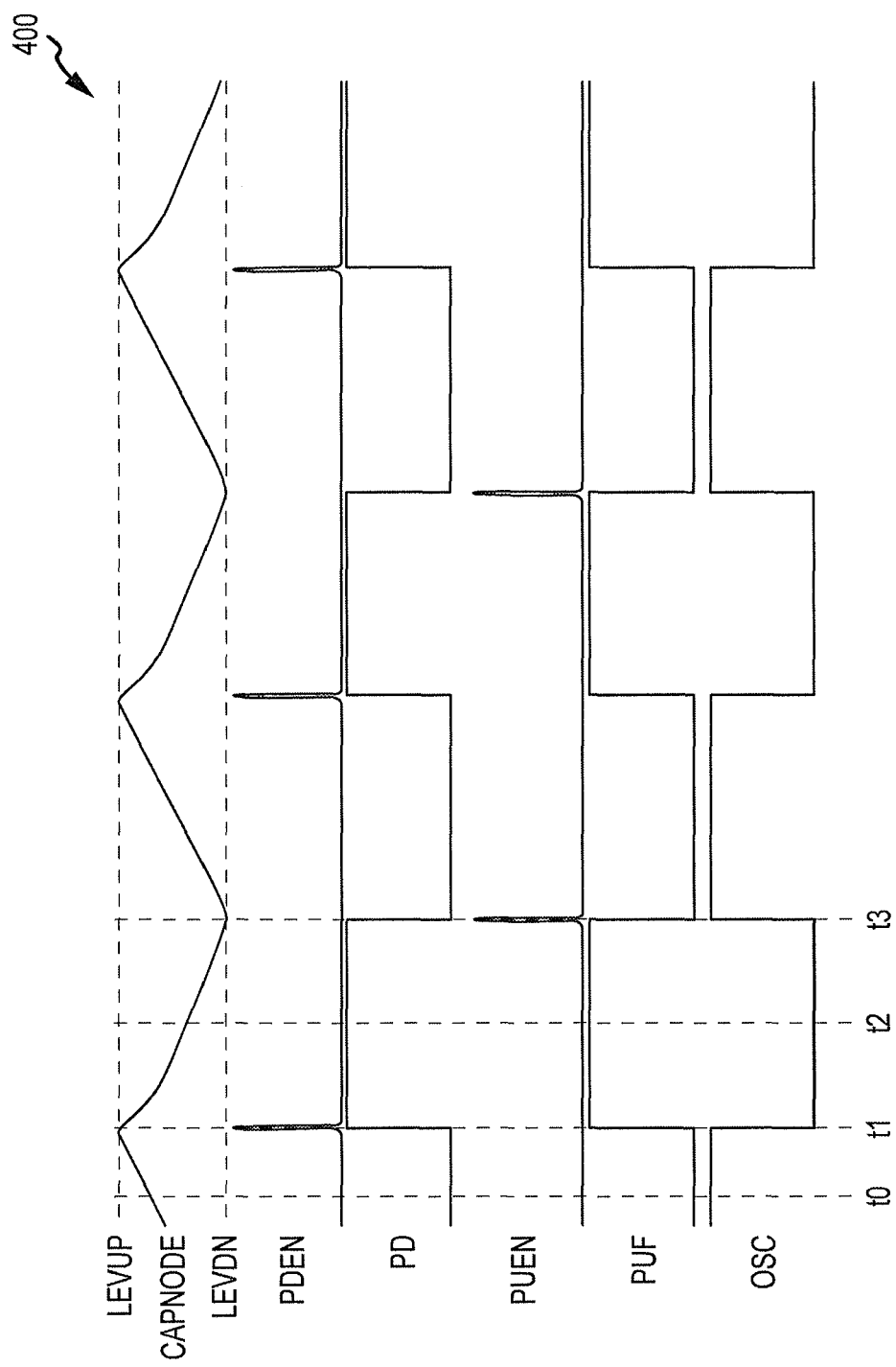
FIG. 4 is a timing diagram for the oscillator in FIG. 3 according to an embodiment of the invention.

With reference to FIG. 4, and with continuing reference to FIG. 3, the operation of the oscillator circuit 300 in FIG. 3 will now be described in connection with the timing diagram 400 illustrated in FIG. 4. At approximately time t0, the charging circuit 370 is in the process of charging the capacitance 362 in the capacitance circuit 360 at the substantially constant charging current IPU, as mirrored from the reference current IREF responsive to the charge signal PUF being provided as logic low. At approximately time t1, the voltage CAPNODE measured at the measurement node 363 of the capacitance circuit 360 reaches, and slightly exceeds, the second reference voltage LEVUP. Responsive to the voltage CAPNODE substantially equaling and/or being greater than the second reference voltage LEVUP, the control signal PDEN provided by the first comparator 342 spikes, which in turn causes the signal latched by the NOR gates 351, 352 in the logic circuit 350 to transition to logic low. As a result, the discharge signal PD and the charge signal PUF provided by the logic circuit 350 transition to logic high, which in turn causes the pFET 374 of the charging circuit 370 to become non-conductive and causes the nFET 384 of the discharging circuit 380 to become conductive. The charge stored on the capacitance 362 in the capacitance circuit 360 begins to discharge through to the reference voltage node such as ground.

At approximately time t2, the discharging circuit 380 is in the process of discharging the capacitance 362 in the capacitance circuit 360 at the substantially constant discharging current IPD, as mirrored from the reference current IREF responsive to the discharge signal PD being provided as logic high. At approximately time t3, the voltage CAPNODE measured at the measurement node 363 of the capacitance circuit 360 decreases to, and slightly below, the first reference voltage LEVDN. Responsive to the voltage CAPNODE decreasing to and/or below the first reference voltage LEVDN, the control signal PUEN provided by the second comparator 344 spikes, which in turn causes the signal latched by the NOR gates 351, 352 in the logic circuit 350 to transition to logic high. As a result, the discharge signal PD and the charge signal PUF provided by the logic circuit 350 to transition to logic low, which in turn causes the nFET 384 of the discharging circuit 380 to become non-conductive and causes the pFET 374 of the charging circuit 370 to become conductive. The capacitance 362 in the capacitance circuit 360 begin charging once again.

In general, the positive and negative slopes of the CAPNODE voltage signal are determined by the respective charging current IPU and discharging current IPD, which are both mirrored from the reference current IREF and are therefore proportional to the difference between the first and second reference voltages LEVDN, LEVUP, which in turn may or may not be proportional to the supply voltage provided to the oscillator circuit 300.

As noted above, the CAPNODE voltage signal may increase slightly above (e.g. "overshoot") the second reference voltage LEVUP and may decrease slightly below (e.g., "undershoot") the first reference voltage LEVDN in some embodiments. In these embodiments, the amount of "overshoot" and "undershoot" may be relatively small (e.g., less than 5% or less than 1% of the difference between LEVDN and LEVUP) and thus not substantially affect the period TOSC of the oscillation signal OSC.

Figure 5:
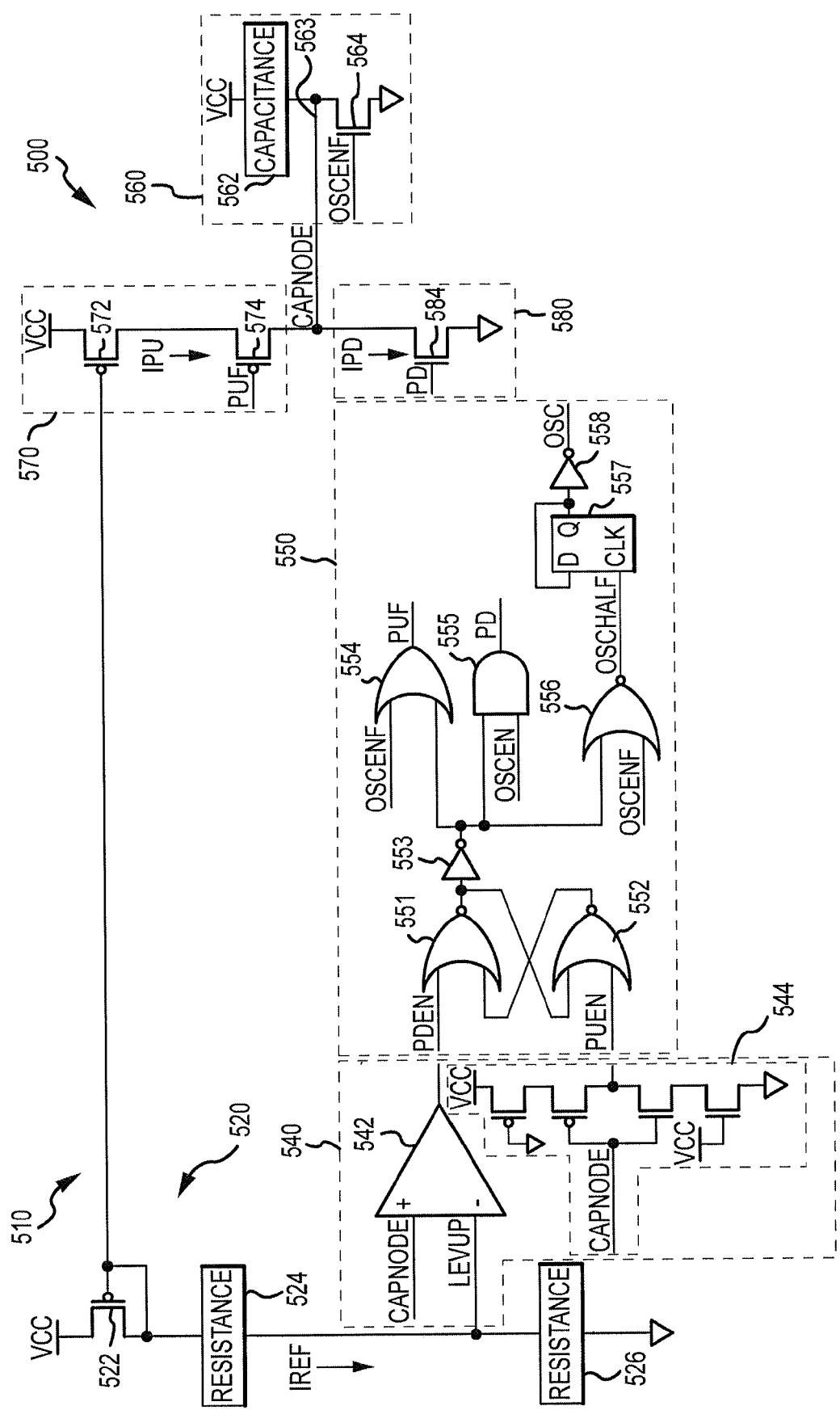
FIG. 5 is a partial schematic diagram of an oscillator according to an embodiment of the invention.

FIG. 5 illustrates a schematic diagram of an oscillator circuit 500 according to an embodiment of the invention. The oscillator circuit 500 may be used for the oscillator circuit 100 in FIG. 1 or the oscillator circuit 200 in FIG. 2. The oscillator 500 illustrated in FIG. 5 is similar to the oscillator 400 illustrated in FIG. 4, except that the oscillator 500 illustrated in FIG. 5 includes different examples of a comparator and a discharging circuit 580, among other things. The oscillator circuit 500 in FIG. 5 includes a control circuit 510, a reference circuit 520, a detector circuit 540, a logic circuit 550, a capacitance circuit 560, a charging circuit 570, and a discharging circuit 580.

The reference circuit 520 includes a p-channel field effect transistor (pFET) 522 with its source coupled to a supply voltage node, such as VCC. The drain of the pFET 522 is coupled to a voltage divider with two serially coupled resistances 524, 526, which are in turn coupled to a reference voltage node such as ground. The gate of the pFET 522 is also coupled to its drain, thereby forming one portion of a pFET current mirror. As will be described below, the gate of the pFET 522 is also coupled to the charging and discharging circuit 570.

In the example shown in FIG. 5, the reference circuit 520 provides a reference current IREF, which is directly proportional to the supply voltage VCC and inversely proportional to the resistances 524, 526. The first reference voltage of the oscillator circuit 500 may be defined as ground in the illustrated embodiment; this is similar to if, with reference to FIG. 3, LEVDN was set substantially equal to ground. Defining the first reference voltage as ground has the benefit of not requiring a second comparator and, because as described in more detail below, a FET-based inverter can be used to generate the control signal PUEN. The voltage divider of the reference circuit 520 is used, however, to define a second reference voltage LEVUP by tapping the voltage between resistances 524 and 526.

The detector circuit 540 includes two comparators 542, 544, although as shown in FIG. 5 the second comparator 544 may be a different design than the first comparator 542. The first comparator 542 may be an operational amplifier and may generally be similar to the first comparator 342 illustrated in FIG. 3.

The voltage CAPNODE of the capacitance circuit 560 is provided to the input node of the second comparator 544. The second comparator 544 provides, in response, the control signal PUEN, which, as mentioned above may be an enable signal indicating that the capacitance circuit 560 needs to be charged. The second comparator 544 may be a FET-based inverter, with two pFETs and two nFETs coupled in series, with the uppermost pFET and the lowermost nFET having relatively long channels and always on. These extra pFET and nFET may help increase the resistance of the inverter and thereby reduce the current consumed by the comparator 544. Similar to the comparator 344 in FIG. 3, however, the comparator 544 in FIG. 5 acts as a level detector to determine when the voltage CAPNODE of the capacitance circuit 560 decreases to be substantially equal to or below the first reference voltage, which is ground in the embodiment illustrated in FIG. 5. When, in operation, the voltage CAPNODE of the capacitance circuit 560 decreases to be substantially equal to or below the first reference voltage (e.g., ground), the comparator 544 causes the control signal PUEN to transition to logic high relatively quickly.

The control signals PDEN, PUEN are provided by the detector circuit 540 to the logic circuit 550. The logic circuit 550 is generally similar to the logic circuit 350 illustrated in FIG. 3 and described above, except that the NOR gate 556 provides a OSCHALF signal. As illustrated in FIG. 5, in some but not all embodiments, the output of the NOR gate 556 may be provided to the clock node of a flip-flop 557 with its input coupled to its output to serve as a frequency divider in order to correct duty cycle. The output of the flip-flop 557 is also provided to an inverter 558, which in turn provides the oscillation signal OSC at approximately half the frequency of the OSCHALF signal, but with approximately a 50-50 duty cycle.

The capacitance circuit 560 of the oscillator circuit 500 may generally be similar to the capacitance circuit 360 illustrated in FIG. 3 and described above. Also, the charging circuit 570 in FIG. 5 may generally be similar to the charging circuit 370 illustrated in FIG. 3 and described above. The discharging circuit 580 illustrated in the embodiment in FIG. 5, however, includes a single nFET 584 coupled in between the measurement node 563 of the capacitance circuit 560 and a reference voltage node, such as ground. Thus the discharging circuit 580 in FIG. 5 does not include a current mirror, which may allow the oscillator circuit 500 to consume less current and therefore less power than the oscillator circuit 300 illustrated in FIG. 3 in some instances.

When nFET 584 is conductive (e.g., when the discharge signal PD is a logic high), nFET 584 discharges the capacitance circuit 560 at a relatively fast rate that may not be proportional to the reference current IREF, whereas when nFET 584 is non-conductive, very little to no current flows from the capacitance circuit 560 the reference voltage node such as ground.

Because the discharging circuit 580 discharges the capacitance circuit 560 relatively quickly with respect to the amount of time it takes to charge the capacitance circuit 560 using the substantially constant current IPU from the charging circuit 570, the period TOSC of the oscillation signal may be primarily determined by the time it takes to charge the capacitance circuit.

Figure 6:
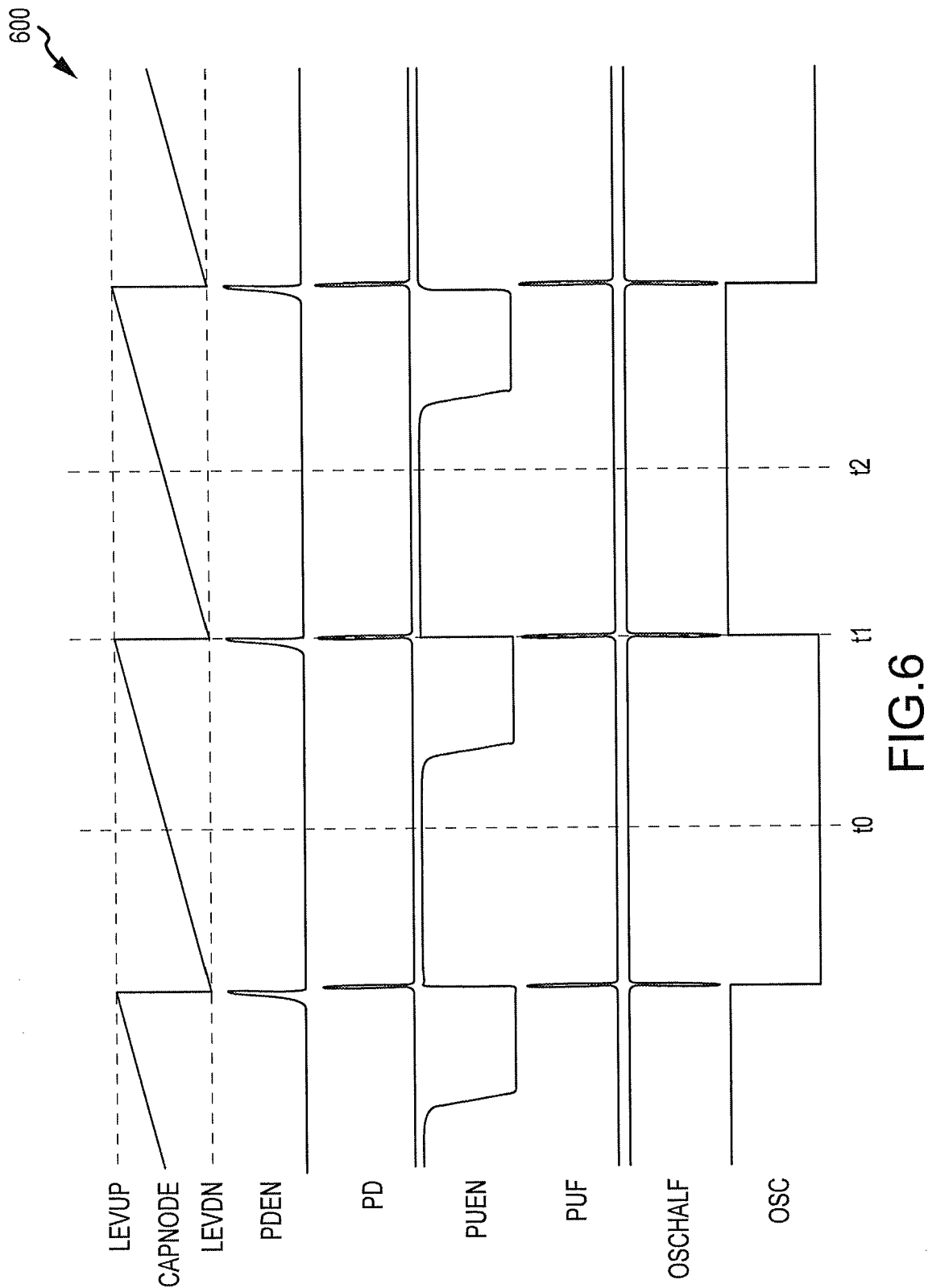
FIG. 6 is a timing diagram for the oscillator in FIG. 5 according to an embodiment of the invention.

With reference to FIG. 6, and with continuing reference to FIG. 5, the operation of the oscillator circuit 500 in FIG. 5 will now be described in connection with the timing diagram 600 illustrated in FIG. 6. At approximately time t0, the charging circuit 570 is charging the capacitance 562 in the capacitance circuit 560 at the substantially constant charging current IPU, as mirrored from the reference current IREF responsive to the charge signal PUF being provided as logic low. At approximately time t1, the voltage CAPNODE measured at the measurement node 563 of the capacitance circuit 560 reaches, and slightly exceeds, the second reference voltage LEVUP. Responsive to the voltage CAPNODE substantially equaling and/or being greater than the second reference voltage LEVUP, the control signal PDEN provided by the first comparator 542 spikes, which in turn causes the signal latched by the NOR gates 551, 552 in the logic circuit 550 to transition to logic low. As a result, the discharge signal PD and the charge signal PUF provided by the logic circuit 550 transition to logic high, which in turn causes the pFET 574 of the charging circuit 570 to become non-conductive and causes the nFET 584 of the discharging circuit 580 to become conductive. The charge stored on the capacitance 562 in the capacitance circuit 560 discharges through to the reference voltage node such as ground. As mentioned above, the capacitance 562 is discharged relatively quickly, for example, over a period of 200 picoseconds. Therefore, still at approximately time t1 (e.g., t1 plus 200 picoseconds), the voltage CAPNODE measured at the measurement node 563 of the capacitance circuit 560 decreases to the first reference voltage or ground in the embodiment illustrated in FIG. 5. Responsive to the voltage CAPNODE decreasing to ground, the control signal PUEN provided by the second comparator 544 transitions to logic high, which in turn causes the signal latched by the NOR gates 551, 552 in the logic circuit 550 to transition to logic high. As a result, the discharge signal PD and the charge signal PUF provided by the logic circuit 550 transition to logic low, which in turn causes the nFET 584 of the discharging circuit 580 to become non-conductive and causes the pFET 574 of the charging circuit 570 to become conductive. The capacitance 562 in the capacitance circuit 560 begins charging once again. At time t2, the charging circuit 570 is once again charging the capacitance 562 at a substantially constant rate.

In general, the positive slope of the CAPNODE voltage signal is determined by the charging current IPU, which is mirrored from the reference current IREF and is therefore proportional to the difference between the first and second reference voltages LEVDN.

Still with reference to FIGS. 5 and 6, the flip-flop 557 may correct the duty cycle of OSCHALF and generate the oscillation signal OSC, which may have a period that is approximately twice as long as the period of the OSCHALF signal.

Figure 7:
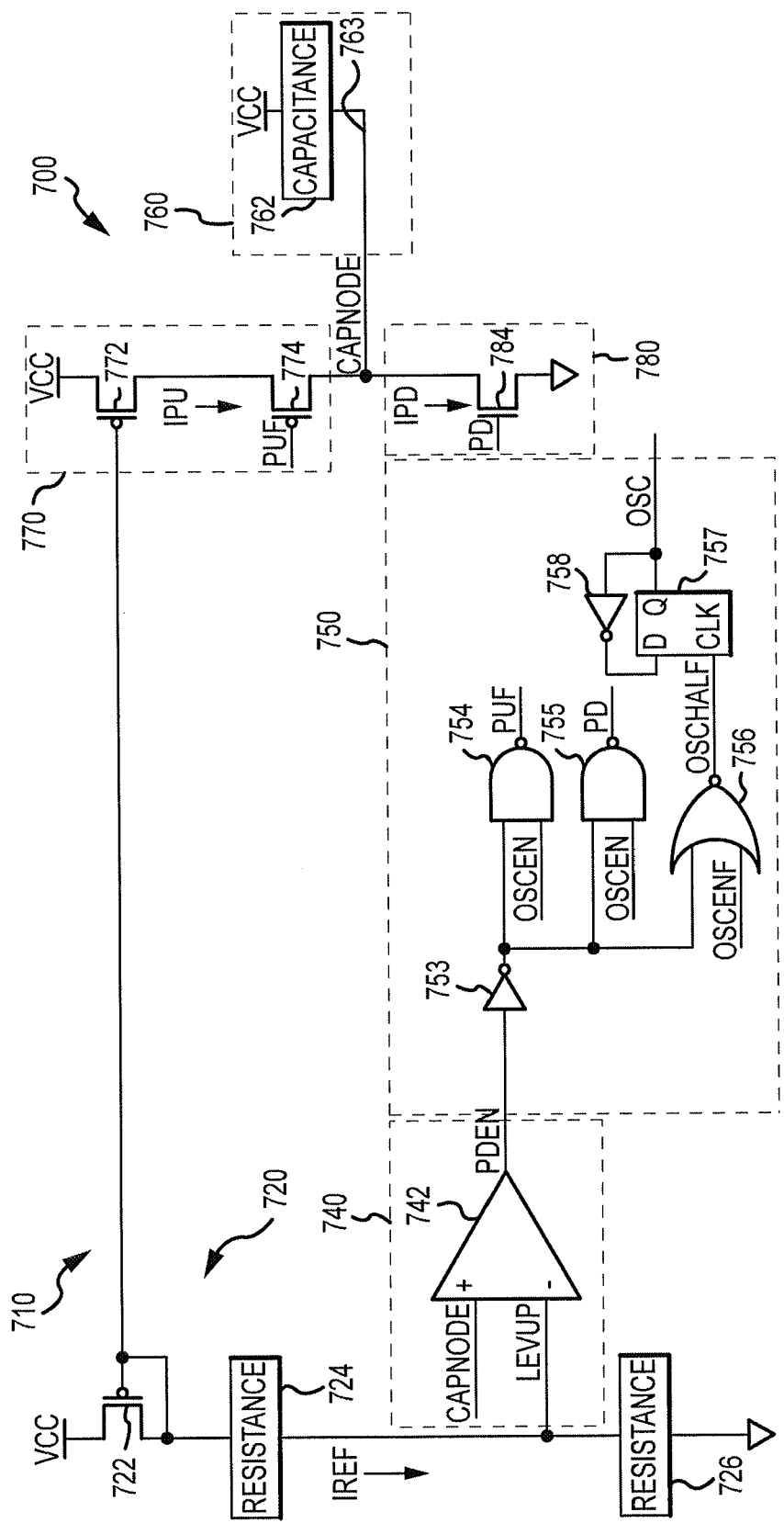
FIG. 7 is a partial schematic diagram of an oscillator according to an embodiment of the invention.
Figure 8:
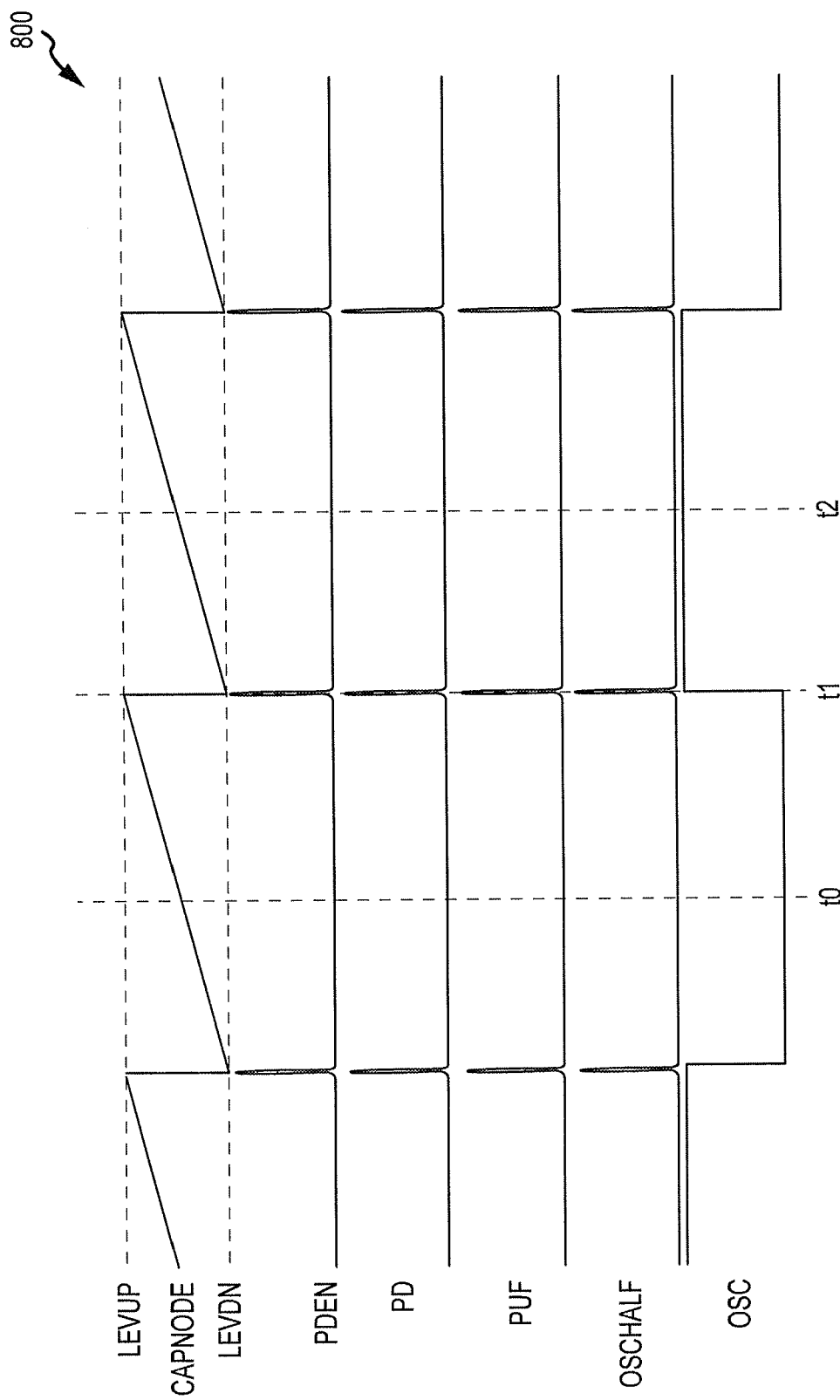
FIG. 8 is a timing diagram for the oscillator in FIG. 7 according to an embodiments of the invention.

FIG. 7 illustrates another example of an oscillator 700 that is similar to the oscillator 500 illustrated in FIG. 5, and includes many of the same elements that are labeled with similar reference numerals. The oscillator in FIG. 7, however, does not include a second comparator (comparable to the second comparator 544 in FIG. 5) and includes different elements within its logic circuit 750. As illustrated in the timing diagram 800 of FIG. 8, the oscillator 700 illustrated in FIG. 7 has substantially the same operation as the oscillator 500 illustrated in FIG. 5.

Figure 9:
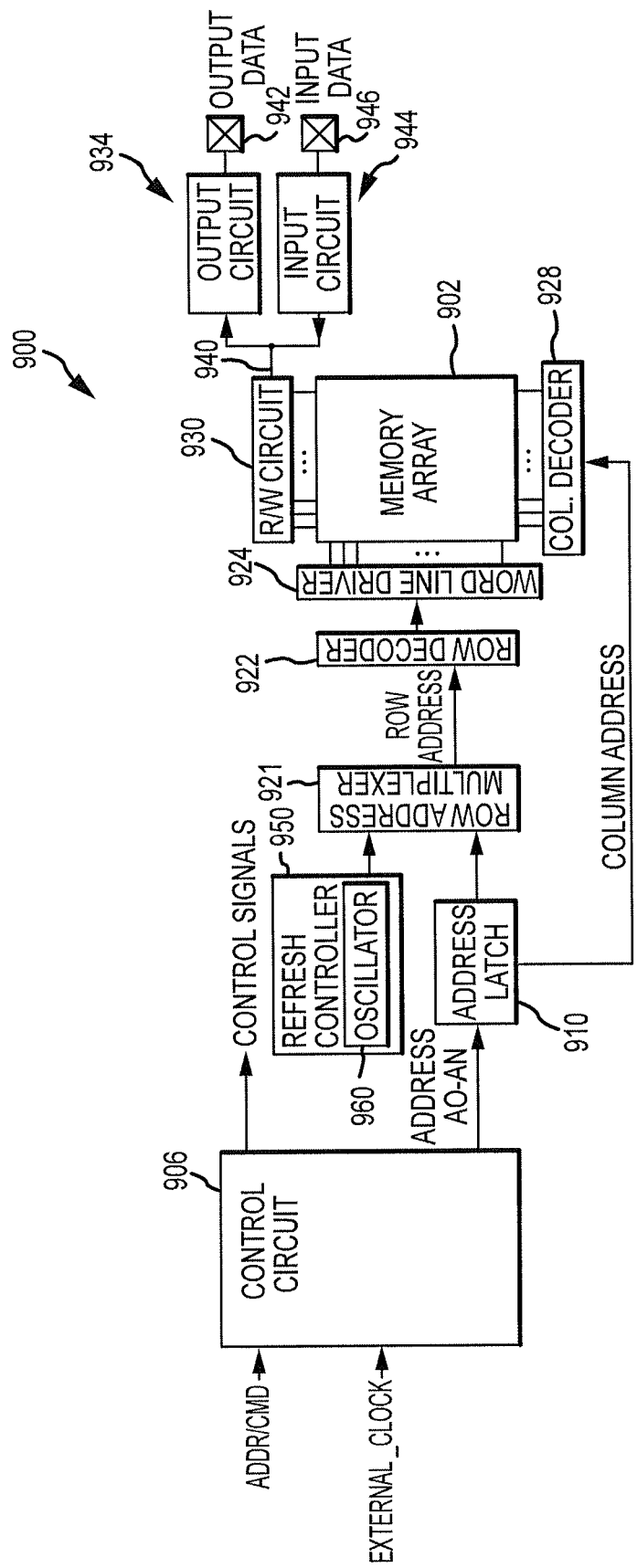
FIG. 9 is a block diagram of a memory according to an embodiment of the invention.

FIG. 9 illustrates a portion of a memory 900 according to an embodiment of the present invention. The memory 900 includes an array 902 of memory cells, which may be, for example, DRAM memory cells, SRAM memory cells, flash memory cells, or some other types of memory cells. The memory 900 may be, for example, a memory in a portable electronic device, such as a cell phone, audio/video player, laptop, tablet, hand-held instrument, and so forth.

The memory 900 includes a control circuit 906 that receives memory commands and addresses through an ADDR/CMD bus. The control circuit 906 provides control signals, based on the commands received through the ADDR/CMD bus. The control circuit 906 also provides row and column addresses to the memory 900 through an address bus and an address latch 910. The address latch then outputs separate column addresses and separate row addresses.

The row and column addresses are provided by the address latch 910 to a row address multiplexer 921 and a column address decoder 928, respectively. The column address decoder 828 selects bit lines extending through the array 902 corresponding to respective column addresses. The row address multiplexer 921 also receives row addresses from a refresh controller 950, and in turn is connected to word line driver 924 that activates respective rows of memory cells in the array 902 corresponding to received row addresses. The selected data line (e.g., a bit line or bit lines) corresponding to a received column address are coupled to a read/write circuitry 930 to provide read data to a data output circuit 934 via an input-output data bus 940. An output pad 942 coupled to the data output circuit 934 is used for electrically coupling to the memory 900. Write data are provided to the memory array 902 through a data input circuit 944 and the memory array read/write circuitry 930. An input pad 946 coupled to the data input circuit 942 is used for electrically coupling to the memory 900. The control circuit 906 responds to memory commands and addresses provided to the ADDR/CMD bus to perform various operations on the memory array 902. In particular, the control circuit 906 is used to provide internal control signals to read data from and write data to the memory array 902.

The refresh controller 950 may be used by the memory 900 to self-refresh the DRAM memory cells (as one example) in the memory array 902. The refresh controller 950 may provide commands and addresses to the row address multiplexer 921, which in turn provides the commands and addresses to the row decoder 922 to refresh rows of the memory array 802 in any suitable manner.

The refresh controller 950 may include an oscillator 960, which may for example be any of the embodiments of oscillator 100, 200, 300, 500, 700 described herein. The oscillator 960 may be substantially insensitive to variations in the supply voltage provided to the oscillator and, as a result, may reduce the amount of current used by the memory 900 during refresh operations.

From the foregoing it will be appreciated that, although specific embodiments of the invention have been described herein for purposes of illustration, various modifications may be made without deviating from the spirit and scope of the invention. For example, FIGS. 1, 2, 3, 5, 7 and 9 illustrate embodiments 100, 200, 300, 500, 700, 960 of an oscillator, FIGS. 1, 2, 3, 5 and 7 illustrate embodiments 170, 270, 370, 570, 770 of a charging circuit, FIGS. 1, 2, 3, 5 and 7 illustrate embodiments 180, 280, 380, 580, 780 of a discharging circuit, and so on and so forth. However, other oscillators, charging circuits, discharging circuits, and so forth, may be used, which are not limited to having the same design, and may be of different designs and include circuitry different from the circuitry in the embodiments illustrated in these figures.

For example, although the embodiment of an oscillator 300 is described with use of a pFET-based capacitor for the capacitance 362, an nFET-based capacitance may be used instead, in which case some or all of the components of the oscillator 300 may need to be flipped or otherwise rearranged and altered to accommodate a different type of capacitance. In general, and as mentioned above, many different types of capacitances may be used in the various oscillator circuits described herein, each of which may require different types of modifications to the oscillator circuits.

As another example, although FIGS. 3, 5, and 7 illustrate the use of FET-based current mirrors bipolar junction (BJT)

based current mirrors may be used instead, again with the appropriate modifications to the oscillator circuit.

As still another example, although FIG. 5 illustrated an oscillator 500 wherein the charging current IPU was used as the primary means to provide the oscillation signal OSC, the arrangement of the oscillator 500 in FIG. 5 could be flipped around so that a discharging current is used as the primary means to provide the oscillation signal OSC (e.g., and the charging current would have a much greater magnitude and thereby charge the capacitance circuit 560 relatively quickly).

As still another example, although FIG. 9 shows one example of a memory that includes an oscillator, the oscillators described herein can be used in many other different types of memory, or in many different types of integrated circuits.

Accordingly, the invention is not limited except as by the appended claims.

What is claimed is:

1. An apparatus, comprising:
   a capacitance circuit configured to be charged and discharged;
   a charging circuit coupled to the capacitance circuit and configured to charge the capacitance circuit by a charging current responsive to a charge signal;
   a discharging circuit coupled to the capacitance circuit and configured to discharge the capacitance circuit by a discharging current responsive to a discharge signal; and
   a control circuit coupled to the charging circuit and the discharging circuit, the control circuit configured to provide the charge and discharge signals responsive to a first comparison between a voltage of the capacitance circuit and a first reference voltage and a second comparison between the voltage of the capacitance circuit and a second reference voltage, the control circuit further configured to provide an oscillation signal responsive to the voltage of the capacitance circuit, the control circuit further configured to provide a reference current;
   wherein the reference current and at least one of the charging current or the discharging current are configured to be proportional to a difference between the first reference voltage and the second reference voltage, wherein the control circuit and the charging and/or discharging circuits form a current mirror configured to mirror the reference current as the respective charging current and/or discharging current.

2. The apparatus of claim 1, wherein the charging current, the discharging current, or both the charging and discharging currents are configured to be proportional to a supply voltage provided to the oscillator circuit.

3. The apparatus of claim 2, wherein the difference between the first and second reference voltages is also configured to be proportional to the supply voltage provided to the oscillator circuit.

4. The apparatus of claim 1, wherein the discharging circuit is coupled between the capacitance circuit and a reference voltage node and is configured to discharge the capacitance circuit to the reference voltage node.

5. The apparatus of claim 4, wherein the reference voltage node is ground.

6. The apparatus of claim 1, wherein the control circuit is configured to provide the charge signal responsive to the voltage of the capacitance circuit being substantially equal to or less than the first reference voltage and further configured to provide the discharge signal responsive to the voltage of the capacitance circuit being substantially equal to or greater than the second reference voltage, the first and/or second reference voltages being proportional to the charging current, the discharging current, or both the charging and discharging currents.

7. The apparatus of claim 6, wherein the difference between the first and second reference voltages is configured to be proportional to a supply voltage provided to the oscillator circuit.

8. The apparatus of claim 1, wherein the oscillation signal is configured to be substantially insensitive to a supply voltage provided to the oscillator circuit.

9. The apparatus of claim 1, wherein the capacitance circuit comprises a pFET capacitor.

10. The apparatus of claim 1, further comprising an enable circuit configured to enable and disable the oscillator circuit.

11. An apparatus, comprising:
    a capacitance circuit;
    a charging circuit coupled to the capacitance circuit and configured to charge the capacitance circuit by a charging current responsive to a charge signal;
    a discharging circuit coupled to the capacitance circuit and configured to discharge the capacitance circuit by a discharging current responsive to a discharge signal;
    a reference circuit configured to provide a reference current, a first reference voltage and a second reference voltage;
    a detector circuit coupled to the reference circuit, the detector circuit configured to provide a first control signal responsive to a comparison between a voltage of the capacitance circuit with the first reference voltage and to provide a second control signal responsive to a comparison between the voltage of the capacitance circuit with the second reference voltage; and
    a logic circuit coupled to the detector circuit and configured to provide the charge signal, the discharge signal, and an oscillation signal responsive to the control signals;
    wherein the charging current, the discharging current, or both the charging and discharging currents are configured to be proportional to the reference current.

12. The apparatus of claim 11, wherein the detector circuit includes a first comparator configured to provide the first control signal and a second comparator configured to provide the second control signal.

13. The apparatus of claim 11, wherein the reference current is configured to be proportional to a difference between the first reference voltage and the second reference voltage.

14. The apparatus of claim 11, wherein the reference current, the first reference voltage, and the second reference voltage are configured to be proportional to a supply voltage.

15. The apparatus of claim 11, wherein the reference circuit comprises a voltage divider.

16. The apparatus of claim 15, wherein the first reference voltage is configured to be provided by the voltage divider.

17. The apparatus of claim 16, wherein the detector circuit comprises:
    a first comparator coupled to the voltage divider and configured to compare the voltage of the capacitance circuit to the first reference voltage; and
    a second comparator coupled to the voltage divider and configured to compare the voltage of the capacitance circuit to the second reference voltage.

18. The apparatus of claim 11, wherein a capacitance-voltage (C-V) characteristic of the capacitance circuit is substantially constant in a voltage range defined at least in part by the reference voltage as provided to the capacitance circuit.

19. The apparatus of claim 11, further comprising a frequency divider configured to correct a duty cycle of the oscillation signal.

20. The apparatus of claim 11, further comprising a memory, wherein the oscillation signal is configured to control a refresh controller of the memory.

21. The apparatus of claim 11, wherein the charging circuit is configured to be disabled responsive to the charge signal being inactive and the discharging circuit is configured to be disabled responsive to the discharge signal being inactive.

22. A method, comprising:
    providing a reference current that is proportional to a difference between a first reference voltage and a second reference voltage;
    mirroring the reference current to charge or discharge a capacitance circuit;
    comparing a voltage of the capacitance circuit with each of the first and second reference voltages;
    providing a charge signal responsive to the voltage of the capacitance circuit being substantially equal to or less than the first reference voltage;
    providing a discharge signal responsive to the voltage of the capacitance circuit being substantially equal to or greater than the second reference voltage; and
    providing an oscillation signal responsive to comparing the voltage of the capacitance circuit with at least one of the first and second reference voltages.

23. The method of claim 22, wherein the first, second, or both the first and second reference voltages are proportional to a supply voltage, and the reference current is proportional to the supply voltage.

24. The method of claim 22, wherein the reference current is substantially constant and the reference current is mirrored to charge or discharge the capacitance circuit at a substantially constant rate.

25. The method of claim 22, wherein the first reference voltage is ground.

26. The method of claim 22, further comprising:
    discharging the capacitance circuit responsive to the discharge signal; and
    charging the capacitance circuit responsive to the charge signal.

27. The method of claim 22, further comprising latching a signal indicative of the comparison of the voltage of the capacitance circuit with at least one of the first and second reference voltages.

28. A method, comprising:
    providing a reference current that is proportional to a difference between a first reference voltage and a second reference voltage;
    comparing a voltage of the capacitance circuit with each of the first and second reference voltages;
    mirroring the reference current to charge or discharge a capacitance circuit responsive to a charge signal or a discharge signal, respectively;
    substantially clamping a voltage of the capacitance circuit between the first and second reference voltages; and
    providing an oscillation signal responsive to the clamping.

29. The method of claim 28, wherein the oscillation signal is provided responsive to the voltage of the capacitance circuit being substantially equal to or exceeding the second reference voltage or being substantially equal to or less than the first reference voltage.

30. The method of claim 28, further comprising controlling a self-refresh controller of a memory with the oscillation signal.

31. The method of claim 28, wherein the reference current is mirrored to charge the capacitance circuit, and further comprising matching the mirrored reference current to discharge the capacitance circuit.

32. The method of claim 28, wherein the first, second or both the first and second reference voltages are proportional to a supply voltage, the reference current is proportional to the supply voltage, and the supply voltage changing dynamically causes the reference current and the first, second, or both the first and second reference voltages to change dynamically in response to the supply voltage changing.

* * * * *